United States Patent
Lee et al.

(10) Patent No.: US 8,178,201 B2
(45) Date of Patent: May 15, 2012

(54) ELECTROCONDUCTIVE PARTICLE COMPRISING GRAPHENE-COATED POLYMER PARTICLE, ANISOTROPIC CONDUCTIVE FILM COMPRISING SAME AND METHOD OF MAKING THEREOF

(75) Inventors: Sang-Soo Lee, Seoul (KR); Kyunghee Kim, Seoul (KR); Soon Ho Lim, Seoul (KR); Min Park, Seoul (KR); Jun Kyung Kim, Seoul (KR); Heesuk Kim, Seoul (KR); Hyunjung Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 258 days.

(21) Appl. No.: 12/579,791

(22) Filed: Oct. 15, 2009

(65) Prior Publication Data

US 2010/0247892 A1    Sep. 30, 2010

(30) Foreign Application Priority Data

Mar. 31, 2009  (KR) ................ 10-2009-0027787
May 26, 2009  (KR) ................ 10-2009-0046071

(51) Int. Cl.
*B32B 5/16*  (2006.01)
*B05D 7/00*  (2006.01)

(52) U.S. Cl. ......... 428/403; 427/222; 428/327; 428/407
(58) Field of Classification Search .......... 428/403–407; 427/222

See application file for complete search history.

(56) References Cited

U.S. PATENT DOCUMENTS

| | | | | |
|---|---|---|---|---|
| 6,828,015 | B2* | 12/2004 | Hirata et al. | 428/323 |
| 7,354,988 | B2* | 4/2008 | Charati et al. | 528/271 |
| 7,566,410 | B2* | 7/2009 | Song et al. | 252/511 |
| 7,623,340 | B1* | 11/2009 | Song et al. | 361/502 |
| 7,745,528 | B2* | 6/2010 | Prud'Homme et al. | 524/495 |
| 7,943,065 | B2* | 5/2011 | El Bounia | 252/511 |
| 2006/0030483 | A1* | 2/2006 | Jang | 502/400 |
| 2008/0248275 | A1* | 10/2008 | Jang et al. | 428/220 |
| 2010/0021819 | A1* | 1/2010 | Zhamu et al. | 429/231.8 |

OTHER PUBLICATIONS

Zhang et al, Electrical Conductivity of Melt Compounded Functionialized Graphene Sheets Filled Polyethyeleneterephthalate Composites, Physics and Applicationis of Graphehe-Experiments, pp. 409-420 (circa 2009).*
Stankovich et al, Graphene-based composite materials, Nature Letters, vol. 442, pp. 282-286, Jul. 2006.*
Salavagione et al., Recent Advances in the covalent modification of graphene with polymers, Macromol. Rapid Commun., 32, 1771-1789 (2011).*

* cited by examiner

*Primary Examiner* — Hoa (Holly) Le
(74) *Attorney, Agent, or Firm* — Ladas & Parry LLP

(57) ABSTRACT

An electroconductive particle that includes (a) a polymer microparticle, and (b) a graphene coating layer grafted on the polymer microparticle, which has improved long-term stability of the conductivity, surface conductivity, durability, and thermal resistance, and is applicable for producing an anisotropic conductive film used for packaging electronic devices.

20 Claims, 6 Drawing Sheets

ELECTROCONDUCTIVE PARTICLE COMPRISING GRAPHENE-COATED POLYMER PARTICLE, ANISOTROPIC CONDUCTIVE FILM COMPRISING SAME AND METHOD OF MAKING THEREOF

FIELD OF THE INVENTION

The present invention relates to an electroconductive particle, which is suitable for preparing an anisotropic conductive film used for packaging electronic devices, and an anisotropic conductive film comprising same.

BACKGROUND OF THE INVENTION

Electronic packaging technologies used in various steps involved in the process of preparing a variety of electronic products using semiconductor devices are very important for the reason that the performance characteristics, size, price, reliability, and durability of the final products depend thereon.

In response to the recent trend of making the gap narrower and the connection density higher, it has become essential in the field of packaging semiconductor or display that a plurality of electrodes formed in a narrow gap can be simultaneously connected. Accordingly, in the liquid crystalline display (LCD) packaging field, an electroconductive adhesive is employed in order to form a mechanical and electrical connection between the access printed circuit boards and transparent electrodes.

Such an electroconductive adhesive is generally used in the form of an anisotropic conductive film (AFC) or an isotropic conductive adhesive (ICA), preferably an anisotropic conductive film composed of electroconductive particles dispersed in a thermosetting or thermoplastic insulation resin.

There have been used as electroconductive particles that function as an electroconductor, carbon-based powders or fibers, solder balls of e.g., Ag, and nickel (Ni) particles or polymer balls coated with Ni.

Nickel used as electroconductive particles of an anisotropic conductive film is not expensive and has a relatively good electroconductivity, but it tends to undergo erosion or oxidation when exposed to a high temperature/high humidity condition. A method of coating nickel particles with gold (Au) was suggested in order to solve such a problem. Also, a method has recently developed to coat polystyrene particles comprising crosslinking monomer, e.g., divinylbenzene, with nickel, and coat the coated Ni particles with gold.

However, electroconductive particles that consist of polymer microparticles coated with a metal also have several problems in that: they have poor long-term stability of the conductivity and of the mechanical properties because of the low interfacial bonding strength between the polymer microparticles and the metallic coating layer; and their production is costly and generates a large amount of environmentally harmful materials.

One of the conventional electroconductive particles, which is prepared by a method comprising the step of disposing a metal on the surface of a polymer microparticle by pressurizing and heating to form a conductive region, also has the problem that the metallic coating layer is easily cracked and peeled off from the polymer microparticle. Accordingly, an anisotropic conductive film composed of such conventional electroconductive particles dispersed in an insulation resin is hampered by high contact resistance and low reliability.

Therefore, there exists a need to develop an electroconductive particle having improved performance characteristics in terms of long-term stability of conductivity, surface conductivity, durability, and thermal resistance, which is devoid of the problems associated with the conventional particles having low conductivity due to the generation of cracks and exfoliation between the polymer microparticle and the metal layer, and is able to maintain a high electroconductivity at a high temperature of 100° C. or more.

SUMMARY OF THE INVENTION

Accordingly, it is a primary object of the present invention to provide an electroconductive particle having improved performance characteristics in terms of long-term stability of conductivity, surface conductivity, durability, thermal resistance as well as electroconductivity.

It is another object of the present invention to provide an anisotropic conductive film comprising said electroconductive particles.

In accordance with one aspect of the present invention, there is provided an electroconductive particle comprising a polymer microparticle and a graphene coating layer grafted on the polymer microparticle.

In accordance with another aspect of the present invention, there is provided an anisotropic conductive film comprising said electroconductive particles.

BRIEF DESCRIPTION OF THE DRAWINGS

The above and other objects and features of the present invention will become apparent from the following description of the invention taken in conjunction with the accompanying drawings, which respectively show.

DETAILED DESCRIPTION OF THE INVENTION

The present invention provides an electroconductive particle having improved performance characteristics in terms of long-term stability of conductivity, surface conductivity, durability, thermal resistance, as well as electroconductivity, which comprises a graphene coating layer having excellent electroconductivity disposed on a polymer microparticle.

According to one embodiment of the present invention, there is provided an electroconductive particle comprising a polymer microparticle and a graphene coating layer grafted on the polymer microparticle.

Figure 1:
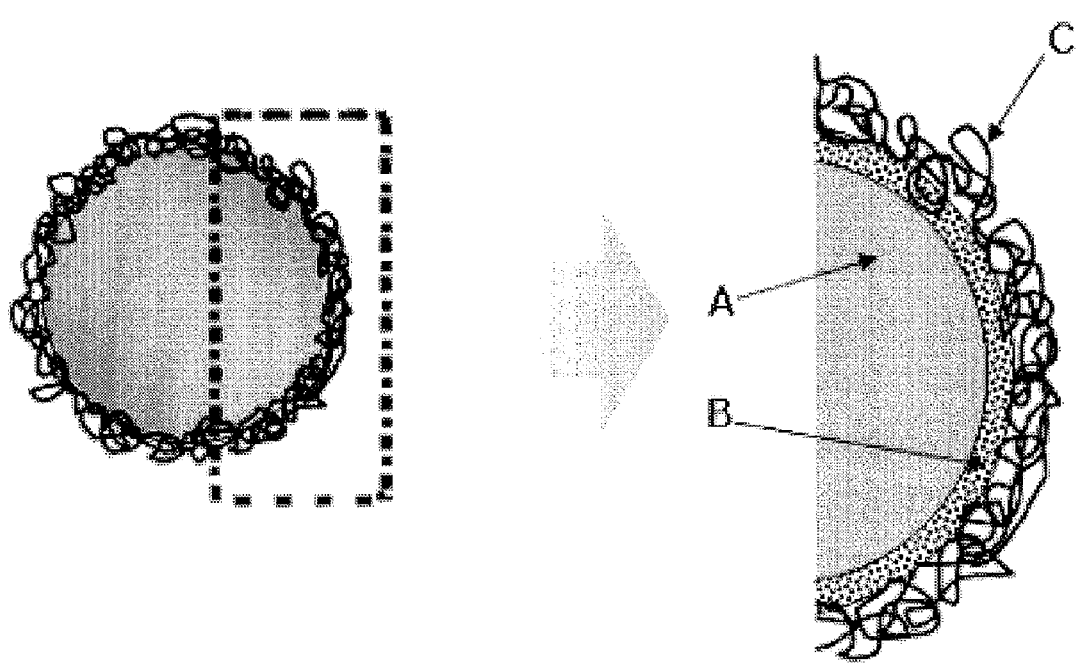
FIG. 1: a cross section of the electroconductive particle in accordance with the present invention (wherein A, B, and C indicate polymer microparticle, chemical bonding layer, and graphene coating layer, respectively)

FIG. 1 schematically shows a cross section of the electroconductive particle in accordance with the embodiment of the present invention.

Referring to FIG. 1, the electroconductive particle of the present invention comprises a polymer microparticle having a plurality of first functional groups on the surface thereof (A), a graphene coating layer having a plurality of second functional groups that can from chemical bonds with the first functional groups of the polymer microparticle (C), and a layer of the chemical bonding region formed between the first functional groups of the polymer microparticle and the second functional groups of the graphene (B).

The first functional groups introduced to the surface of the polymer microparticle bond with the second functional groups of the graphene to form the inventive electroconductive particle.

The chemical bonds may be either covalent or ionic bonds, and the first functional groups of the polymer microparticle may each be a functional group that can undergo a condensation-reaction (condensation-reactive functional group) or an ionic functional group, and the second functional groups of the graphene may each be a functional group that can form a covalent bond with the condensation-reactive functional group of the polymer microparticle or a functional group that can form an ionic bond with the ionic functional group of the polymer microparticle.

Examples of the condensation-reactive functional group and the second functional group that can form a covalent bond with the condensation-reactive functional group include, but are not limited to, carboxyl (—COOH), hydroxyl (—OH), alkoxycarbonyl (—COOR$^1$), amino (—NH$_2$), and thioxy (—SH), wherein R$^1$ is C$_1$-C$_{10}$ alkyl, phenyl, or benzyl.

The covalent bonds such as ester bonds (—COO—), amide bonds (—CONH—), and disulfide bonds (—S—S—) may be formed through a reaction of the first functional groups of the polymer microparticle with the second functional groups of the graphene.

As such covalent bonds are stable even at a high temperature, the inventive electroconductive particle has improved performance characteristics in terms of durability and thermal resistance, without any detachment between the polymer microparticle and the graphene coating layer at a high temperature. Further, the electroconductive particle of the present invention can also maintain satisfactory electroconductivity at a high temperature.

Examples of the ionic functional group and the second functional group that can form an ionic bond with the ionic functional group include, but are not limited to, carboxyl, hydroxyl, sulfonyl, quaternary ammonium, and amino.

The ionic bond may be formed through ionic interactions between a cationic moiety such as —NR$^2_3{}^+$ (wherein R$^2$ is hydrogen, C$_1$-C$_{10}$ alkyl or C$_6$-C$_{12}$ aryl) and an anionic moiety such as —COO$^-$, —O$^-$ and —SO$_3{}^-$.

In the electroconductive particle, if the content of the polymer microparticle is too high, the electroconductivity of the particle becomes unsatisfactory. On the other hand, if the content of the graphene is too high, structural stability becomes poor, and it becomes difficult to form a particle. Accordingly, it is preferred that the relative weight ratio of the polymer microparticle and the graphene coating layer is 20:80 to 99.9:0.1.

Specifically, when covalent bonds are formed between the polymer microparticle and the graphene coating layer, it is preferred that the relative weight ratio of the polymer microparticle and the graphene coating layer is in the range of 20:80 to 85:15, more preferably 50:50 to 70:30 so that the inventive electroconductive particle can simultaneously attain good electroconductivity and durability. On the other hand, when ionic bonds are used to graft the graphene coating layer on the polymer microparticle, it is preferred that the relative weight ratio of the polymer microparticle and the graphene coating layer is in the range of 50:50 to 99.1:0.1.

Further, the electroconductive particle of the present invention may have a particle size that is almost the same as that of the polymer microparticle since the thickness of the graphene coating layer is very thin. Preferably, the electroconductive particle has an average particle size of 0.1 to 10 μm.

According to another embodiment of the present invention, there is provided a method for preparing an electroconductive particle comprising the steps of:

(1) preparing polymer microparticles having a plurality of first functional groups on the surface thereof;

(2) introducing to the surface of graphene a plurality of second functional groups that can form chemical bonds with the first functional groups of the polymer microparticles to obtain functionalized graphene; and (3) grafting the functionalized graphene prepared in step (2) on the surface of the polymer microparticles prepared in step (1) through forming chemical bonds between the first functional groups of the polymer microparticles and the second functional groups of the graphene to form a graphene coating layer.

Specifically, when the chemical bonds are covalent bonds, the inventive method for preparing the electroconductive particle may comprise the steps of:

(1) preparing polymer microparticles having a plurality of condensation-reactive functional groups on the surface thereof;

(2) introducing to the surface of graphene a plurality of second functional groups that can form covalent bonds with the condensation-reactive functional groups of the polymer microparticle to obtain functionalized graphene; and (3) grafting the functionalized graphene prepared in step (2) on the surface of the polymer microparticles prepared in step (1) through forming covalent bonds between the condensation-reactive functional groups of the polymer microparticle and the second functional groups of the graphene to form a graphene coating layer.

Step (1)

Step (1) provides a polymer microparticle having a plurality of condensation-reactive functional groups on the surface thereof.

Specifically, the polymer microparticle having a plurality of condensation-reactive functional groups on the surface thereof can be prepared by dispersion polymerizing, emulsion polymerizing, or suspension polymerizing monomers for forming polymer microparticles and the above reaction can be carried out together with a variety of auxiliary monomers in solvent in the presence of a crosslinking agent, a polymerization initiator, and a dispersing agent.

The monomers for forming polymer microparticles are preferably used together with the auxiliary monomers in that a concentration of the first functional groups of the polymer microparticle can be easily controlled.

Desirably, the polymer microparticles can be prepared by the dispersion polymerization for the reason that the suspension polymerization may not easily produce uniform size of the polymer microparticles, and the emulsion polymerization may require a variety of processes in order to obtain several micrometer orders of the polymer microparticles.

There is no restriction on the types of the monomers for forming polymer microparticles, which may be of the form of beads. The monomer is preferably a hydrophobic vinyl-based compound such as an aromatic vinyl compound and an unsaturated carboxylic acid ester compound.

Examples of the aromatic vinyl compound include, but are not limited to, styrene, p-hydroxystyrene, p-acetoxystyrene, p-carboxylstyrene, α-methylstyrene, α-chlorostyrene, p-tert-butylstyrene, p-methylstyrene, p-chlorostyrene, o-chlorostyrene, 2,5-dichlorostyrene, 3,4-dichlorostyrene, dimethylstyrene, and divinylbenzene. Examples of the unsaturated carboxylic acid ester compound include, but are not limited to, methyl acrylate, methyl methacrylate, ethyl acrylate, ethyl methacrylate, propyl acrylate, propyl methacrylate, butyl acrylate, and butyl methacrylate. Said type of monomers may be employed alone, or in combination thereof.

The auxiliary monomer may be a variety of polymer materials having a number average molecular weight of from 2,000 to 200,000, and it is preferred that they have at least one, more preferably two or more functional groups.

Examples of the auxiliary monomer include p-hydroxystyrene, p-acetoxystyrene, p-carboxylstyrene, methacryloxyethyl trimethylammoniumchloride, polyethyleneglycol methylmethacrylate, polyethyleneglycol methylethermethacrylate, polyethyleneglycol methacrylate, polypropyleneglycol methacrylate, polypropyleneglycol dimethacrylate, and mixtures thereof.

Preferably, the auxiliary monomer may be employed in an amount of 0.1 to 20 wt %, more preferably 1 to 2 wt %, based on the total weight of the monomers for forming polymer microparticles.

The crosslinking agent may be styrene-based, acryl-based, or metacryl-based olephilic materials, which are same as the monomers used in the preparation of the polymer microparticle. Preferably, the crosslinking agent may be multifunctional materials having at least two vinyl groups as crosslinking functional group. Preferably, the crosslinking agent may be employed in an amount of 0.1 to 20 wt %, more preferably 0.5 to 2 wt %, based on the total weight of the monomer.

The polymerization initiator may be persulfate-based initiator such as calcium persulfate, ammonium persulfate, and sodium persulfate; peroxide-based initiator such as hydrogen peroxide, benzoyl peroxide, and lauryl peroxide; azo-based initiator such as azobisisobutyronitrile (AIBN) and azobisformamide.

Preferably, the polymerization initiator may be employed in an amount of 0.01 to 10 wt %, based on the total weight of the monomer for forming polymer microparticles, the auxiliary monomer, the crosslinking agent, the polymerization initiator and the dispersing agent.

The dispersing agent may be polyvinylpyrrolidone, polyvinylacetate, and hydroxypropyl-cellulose butyl acrylate.

Preferably, the dispersing agent may be employed in an amount of 1 to 2 wt %, based on the total weight of the monomer for forming polymer microparticles, the auxiliary monomer, the crosslinking agent, the polymerization initiator, and the dispersing agent.

There is no restriction on the types of the solvent, which can dissolve the monomer for forming polymer microparticles. Examples of the solvent include, but are not limited to, polar solvent such as water, dimethylsulfoxide (DMSO), tetrahydrofuran (THF), dimethyformamide (DMF), and alcohol; and nonpolar solvent such as benzene, xylene, toluene, and cyclohexane. Particularly, said alcohol may be straight or branched chain $C_1$-$C_{10}$ alcohol, preferably, ethanol, methanol, isopropanol, propanol, butanol, pentanol, hexanol, heptanol, and cyclohexanol.

It is preferred that the monomers are polymerized at a reaction temperature of 50 to 70° C. for the reaction time of 12 to 24 hours.

Desirably, the polymer microparticle is any one of polystyrene-based, polymethacrylate-based, and polyacrylate-based polymer microparticle having a plurality of condensation-reactive functional groups on the surface thereof.

In addition, although there is no restriction on the size of the polymer microparticle, which may be used typically in the art, it is preferred that the polymer microparticle have an average size of 0.1 to 10 μm.

Step (2)

Step (2) provides a functionalized graphene by introducing thereto a plurality of second functional groups that can form covalent bonds with the condensation-reactive functional groups of the polymer microparticle.

Examples of the second functional group include, but are not limited to, —COOH, —COOR$^1$, —OH, —NH$_2$, and —SH, which may be introduced to the surface, the edge face, or the surface and edge face.

The graphene used in the present invention may have high or low crystallinity, and it is commercially available or prepared from graphite by a common method in the art.

Such common method for preparing graphene from graphite is roughly separated into two types of mechanical and physicochemical delaminations. The mechanical delamination repeats the process of attaching and detaching an adhesive tape on graphite lump to peel graphene off therefrom. The physicochemical delamination comprises the steps of dispersing graphite having laminated structure in an appropriate solvent; subjecting the graphite in solvent to oxidation reaction to extend the space between the laminates of the graphite, and, thus to obtain a graphene oxide; and subjecting the graphene oxide to reduction reaction to obtain graphene, while remaining a plurality of polar functional groups such as hydroxyl and carboxyl or positioning a plurality of ionic functional groups on the surface of the graphene oxide in order to prevent the graphene oxide from reverting to its original laminated structure. The latter is preferred over the former in the present invention for the reason that the latter can produce graphene on a large scale while the former gives a low yield.

A process for modifying the graphene to have a plurality of second functional group that can form covalent bonds with the condensation-reactive functional groups may be carried out by a conventional method for surface modification with the feedstock that can give the second functional groups.

There is no restriction on the types of the feedstock, which can give the second functional groups that can form covalent bonds with the condensation-reactive functional groups of the polymer microparticle. Specifically, hydrazine and ammonia may be employed as the feedstock in order to introduce to the graphene the second functional groups of carboxyl and hydroxyl.

The second functional group of alkoxycarbonyl can be introduced to the graphene by further reacting aliphatic alcohols such as methanol and n-hexanol, or aromatic alcohol such as benzylalcohol and phenyl alcohol with the carboxyl group introduced above, and the second functional group of amino can be introduced to the graphene by further reacting difunctional amine compound such as hexamethylenediamine with the carboxyl group introduced above.

H$_2$S may be employed as the feedstock in order to introduce to the graphene the second functional group of thioxy.

Specifically, when the second functional group is carboxyl or hydroxyl, they may be introduced to the graphene by the following process, which comprises the steps of pulverizing and oxidizing a graphite to obtain a graphite oxide, dispersing the graphite oxide by ultrasonic treatment to obtain a graphene oxide, and treating the graphene oxide with such feedstock as hydrazine and ammonia to obtain the functionalized graphene having a plurality of carboxyl and hydroxyl.

The concentration of the second functional groups of the functionalized graphene may be controlled by the degree of the reduction reaction occurred on the surface of the graphene, and the degree of the reduction reaction depends on the relative weight ratio of the hydrazine and ammonia used as the feedstock. As the reduction reaction proceeds further, the concentration of the second functional groups of the functionalized graphene becomes lower and a fewer covalent bonds between the polymer microparticles and the graphene form, while the electroconductivity become higher due to the decline of the defects on the surface of the graphene. In contrast, as the reduction reaction proceeds less, the concentration of the second functional groups of the functionalized graphene becomes higher and a more covalent bonds between the polymer microparticle and the graphene form, while electroconductivity becomes lower. Accordingly, the relative weight ratio of the hydrazine and ammonia is preferably 1:1 to 1:20, more preferably 1:5 to 1:8 for the reason that the resulting electroconductive particle may have an optimum point between the bonding strength and the electroconductivity.

Step (3)

Step (3) provides a graphene coating layer through forming covalent bonds between the polymer microparticle prepared in step (1) and the functionalized graphene prepared in step (2).

More specifically, the covalent bonds between the graphene and the polymer microparticle may be formed through mixing the dispersion of the polymer microparticles having a plurality of condensation-reactive functional groups with the dispersion of the functionalized graphenes having a plurality of second functional groups that can form covalent bonds with the condensation-reactive functional groups of the polymer microparticle.

Examples of a suitable dispersion medium for said dispersion include distilled water, isopropanol, ethanol, methanol, butanol, chloroform, diethylether, hexane, cyclohexane, propyleneglycol monomethyletheracetate, cyclotetrahydrofuran, methylethylketone, and mixtures thereof.

Preferably, the dispersions of the polymer microparticle and the functionalized graphene are mixed in a relative weight ratio in the range of 20:80 to 85:15.

On the other hand, when the chemical bonds are ionic bonds, the inventive method for preparing the electroconductive particles may comprise the steps of:

(1') preparing polymer microparticles having a plurality of ionic functional groups on the surface thereof, (2') introducing to the surface of graphene a plurality of second functional groups that can form ionic bonds with the ionic functional groups of the polymer microparticle to obtain functionalized graphene; and (3') grafting the functionalized graphene prepared in step (2') on the surface of the polymer microparticle prepared in step (1') through forming ionic bonds between the ionic functional groups of the polymer microparticle and the second functional groups of the graphene to form a graphene coating layer.

Step (1')

Step (1') provides a polymer microparticle having a plurality of ionic functional groups on the surface thereof.

Due to the ionic functional group such as carboxyl, hydroxyl, amino, quaternary ammonium, and sulfonyl, positive or negative electric charge is imparted to the polymer microparticle. The electric charge of the polymer microparticle may stem from an ionic functional group of the monomers for forming polymer microparticles and the auxiliary monomers. Accordingly, step (1') may be same as said step (1).

Step (2')

Step (2') provides a functionalized graphene by introducing thereto a plurality of second functional groups having opposite electric charge to those of the polymer microparticle.

The second functional group such as carboxyl, hydroxyl, amino, quaternary ammonium, and sulfonyl may be introduced to the surface, the edge face, or the surface and edge face of the graphene.

The graphene used in step (2') is same as graphene described in said step (2).

A process for modifying the graphene to have a plurality of second functional group that can form ionic bonds with the ionic functional group of the polymer microparticle may be carried out by a conventional method for surface modification using a feedstock that can give the second functional group.

There is no restriction on the types of the feedstock, which can give the second functional groups that can form ionic bonds with the ionic functional group of the polymer microparticle. Specifically, when the second functional group is carboxyl or hydroxyl, they may be introduced to the graphene by the following process, which comprises the steps of pulverizing and oxidizing a graphite to obtain a graphite oxide, dispersing the graphite oxide by ultrasonic treatment to obtain a graphene oxide, and treating the graphene oxide with such feedstock as hydrazine and ammonia to obtain the functionalized graphene having a plurality of carboxyl and hydroxyl groups.

The concentration of the second functional groups of the functionalized graphene may be controlled by the degree of the reduction reaction occurred on the surface of the graphene, and the degree of the reduction reaction depends on the relative weight ratio of the hydrazine and ammonia used as the feedstock. As the reduction reaction proceeds further, the concentration of the second functional groups of the graphene becomes lower, and, thus a weaker ionic bonding strength between the polymer microparticle and the graphene form, while the electroconductivity become higher. In contrast, as the reduction reaction proceeds less, the concentration of the second functional groups of the functionalized graphene becomes higher, and, thus a stronger ionic bonding strength between the polymer microparticle and the functionalized graphene form, while electroconductivity becomes lower. Accordingly, the relative weight ratio of the hydrazine and ammonia is preferably 1:1 to 1:20, more preferably 1:7 for the reason that the resulting electroconductive particle may have an optimum point between the ionic bonding strength and the electroconductivity.

Step (3')

Step (3') provides a graphene coating layer through forming ionic bonds between the polymer microparticle prepared in step (1') and the functionalized graphene prepared in step (2').

More specifically, the covalent bonds between the graphene and the polymer microparticle may be formed through mixing the dispersion of the polymer microparticle having a plurality of ionic functional groups with the dispersion of the functionalized graphene having a plurality of second functional groups that can form ionic bonds with the ionic functional groups of the polymer microparticle.

Examples of a suitable dispersion medium for said dispersion are same as those described in said step (2).

In accordance with the inventive method, it is possible to prepare various sizes and forms of particles having excellent electroconductivity by simple and inexpensive process.

In addition, the electroconductive particle prepared by said method can have a good electroconductivity stemming from the graphene coating layer contained therein.

Specifically, conventional polymer-based particles coated with a metal have a high resistance of at least 700 mΩ/□, while the electroconductive particles of the present invention have a low resistance in the range of 500 to 600 mΩ/□. As a result, they are suitable for a fine pattern forming process that is necessary for preparing a variety of electronic devices such as mobile electronics, liquid crystal display, and e-paper system. Further, the electroconductive particles of the present invention have strong bonding strength between the polymer microparticle and the graphene through forming covalent or ionic bonds therebetween, and, thus are able to prevent from generating cracks and exfoliation on the graphene coating layer and have improved durability. In addition, since the bonding strength is stable even at a high temperature, the electroconductive particle can maintain a high electroconductivity at a high temperature process for preparing a semiconductor device or a electronic printed circuit board.

Due to the improved performance characteristics in terms of durability and heat resistance, the inventive electroconductive particles are applicable to preparing an anisotropic conductive film used for packaging process of electronic devices.

In accordance with one embodiment of the present invention, there is provided an anisotropic conductive film comprising the inventive electroconductive particle and thermosetting or thermoplastic insulation film. There is no restriction on the thermosetting or thermoplastic insulation film, which may be any of those employed commonly in the art.

The following Examples are given for the purpose of illustration only and are not intended to limit the scope of the invention.

EXAMPLE 1

Step (1): Preparation of Polymer Microparticles Having a Plurality of Condensation-Reactive Functional Groups Polymer microparticles having a plurality of hydroxyl groups (—OH, condensation-reactive functional group) were prepared as follows:

A 3-neck flask was charged with a mixture of 200 ml of isopropanol and 10 ml of deionized water, and the flask was maintained at the temperature of 70° C., and stirred at 400 rpm for 30 minutes under a nitrogen atmosphere. Then, 5 mole of polypyrrolidone (dispersing agent), 1 mole of styrene (hydrophobic vinyl-based monomer), 0.5 mole of p-acetoxystyrene (auxiliary monomer), and divinylbenzene (crosslinking agent) in an amount of 3 mol % based on the total weight of the monomer and the auxiliary monomer were added thereto, and stirred for about 10 minutes, followed by conducting a condensation reaction for 8 hours using 1 g of azobisisobutylonitrile as an added polymerization initiator.

The resulting mixture was quenched after completion of the condensation reaction to obtain polymer microparticles. The polymer microparticles were sequentially washed several times with ethanol, methanol, and distilled water, and stirred in 10 mol % of NaOH aqueous solution at room temperature for 1 day to convert acetoxy groups to hydroxyl groups. The resulting particles were washed several times successively with ethanol, methanol, and distilled water, isolated from the solvent by centrifuge, and lyophilized to obtain polymer microparticles of a powder form, the polymer microparticles having an average particle size of about 300 nm.

The above steps of isolating the particles were conducted to determine the size and the form of the polymer microparticle obtained. The polymer microparticle powder was dispersed in 200 ml of DMF at room temperature to be used in the subsequent step.

Step (2): Modification and Dispersion of Graphene

Graphite was powdered for 10 minutes with pulverizer, a mixture of sulphuric acid and deionized water in a relative weight ratio of 1:50 was added thereto, and the resulting mixture was stirred for 2 hours. The resulting product was oxidized using potassium permanganate ($KMnO_4$), distilled water was added thereto at 70° C., and stirred for 10 hours. Then, an aqueous solution of hydrogen peroxide ($H_2O_2$) was added thereto to obtain graphite oxide. The resulting mixture was subjected to centrifuging, washing with HCl and distilled water, and dispersing with ultrasonic treatment, to obtain graphene oxide. The resulting graphene oxide was introduced into a solution containing hydrazine ($N_2H_2$) and ammonia ($NH_3$) in a relative weight ratio of 1:7 to reduce the graphene oxide, to obtain functionalized graphene having carboxyl and hydroxyl groups, the presence of which, was determined by infrared spectroscopic analysis. The contents of the carboxyl and hydroxyl groups present on the surface of the graphene were 0.02 mmol and 0.05 mmol per 1 mg of graphene, respectively.

Step (3): Coating the Polymer Microparticle with the Graphene

The dispersion of the polystyrene microparticle (0.9 g) in DMF (200 ml) prepared in step (1) having a plurality of hydroxyl functional groups was combined with the functionalized graphene (0.1 g) in DMF (200 ml) prepared in step (2). Then, the resulting mixture was stirred with 100 rpm at 100° C. for 24 hours, to obtain a polystyrene microparticle coated with graphene.

Determination of a Form of the Electroconductive Particle and Covalent Bond

The field emission scanning electron microscope (SEM, JEOL. JSM 890) scans of the polystyrene microparticle prepared in step (1) and the electroconductive particle prepared in step (3) are shown in FIGS. 2 and 3, respectively.

Figure 2:
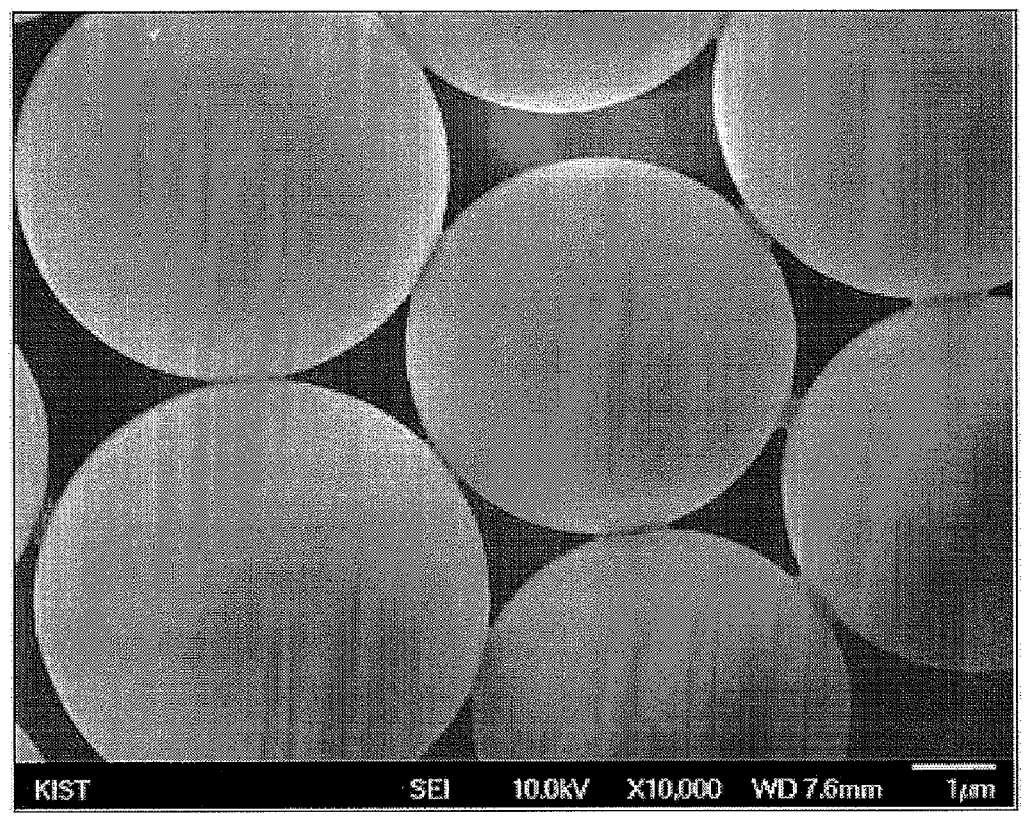
FIG. 2: a scanning electron microscope image of the polymer microparticles prepared in step (1) of Example 1 of the present invention.
Figure 3:
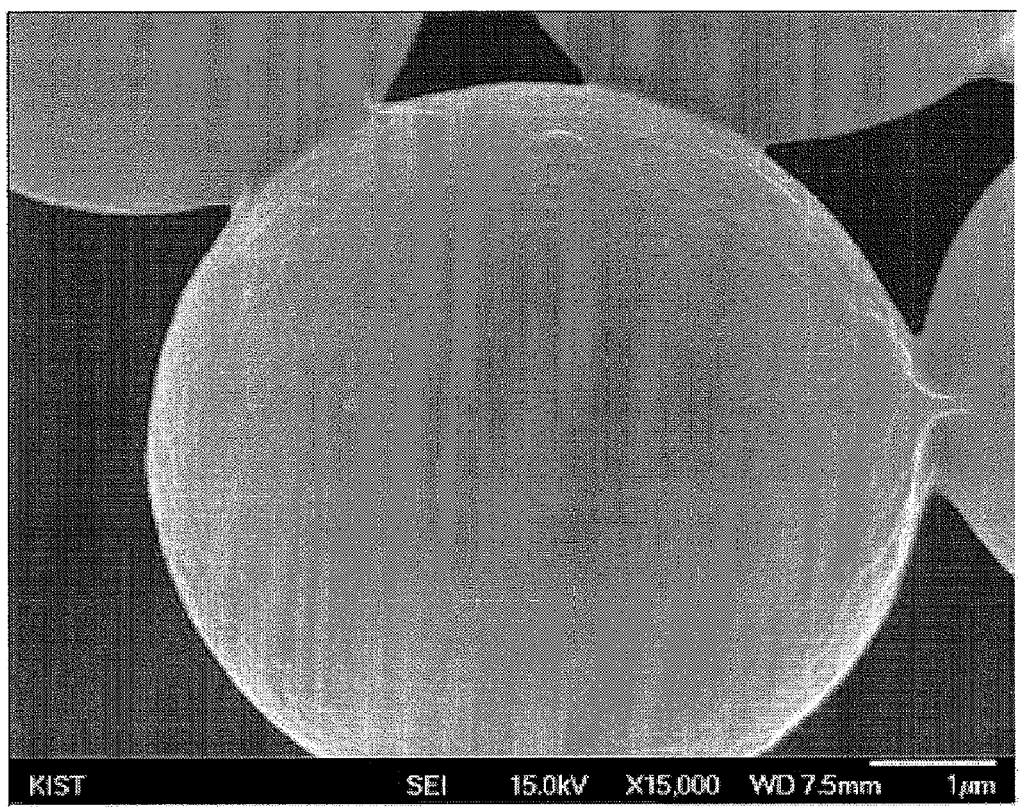
FIG. 3: a scanning electron microscope image of the electroconductive particles prepared in step (3) of Example 1 of the present invention.

As shown in FIG. 2, the polystyrene microparticles prepared in step (1) of Example 1 have a size of about 1 to about 10 μm, while FIG. 3 shows that the polymer microparticles are coated with graphene showing dense curved surfaces.

In addition, it was determined that covalent ester bonds (—COO—) were formed through the reaction of the —COOH groups of the functionalized graphene with the —OH groups of the polymer microparticle, the graphene coating layer being attached to the polystyrene microparticle through covalent bonds.

The electroconductive microparticles having the graphene coating layer were observed to have almost the same size as the polystyrene microparticles since the graphene coating layer is very thin.

EXAMPLE 2

Step (1'): Preparation of Polymer Microparticles Having a Plurality of Ionic Functional Groups A 3-neck flask was charged with a mixture of 200 ml of isopropanol and 10 ml of deionized water, the flask was maintained at the temperature of 70° C., and stirred at 200 rpm for 30 minutes under a nitrogen atmosphere. Then, 5 mole of polypyrrolidone (dispersing agent), 1 mole of styrene (hydrophobic vinyl-based monomer), 0.5 mole of metacryloxyethyltrimethylammoniumchloride (auxiliary monomer to give cationic property), and divinylbenzene (crosslinking agent) in an amount of 3 mol % based on the total weight of the monomer and the auxiliary monomer were added thereto, and stirred for about 10 minutes, followed by conducting a condensation reaction for 8 hours using 1 g of azobisisobutylonitrile (AIBN) as an added polymerization initiator.

The resulting mixture was quenched after completion of the condensation reaction to obtain polymer microparticles. The polymer microparticles were sequentially washed several times with ethanol, methanol, and distilled water, isolated from the solvent by centrifuge, and lyophilized to obtain polymer microparticles having a quaternary ammonium group in a powder form, the polymer microparticles having an average particle size of about 300 nm.

The above steps of isolating the particles were conducted to determine the size and the form of the polymer microparticle obtained. The polymer microparticle powder was dispersed in a mixture of 200 ml of isopropanol and 10 ml of deionized water at room temperature to be used in the subsequent step.

Step (2'): Modification and Dispersion of Graphene

Graphite was powdered for 10 minutes with pulverizer, a mixture of sulfuric acid and deionized water in a relative weight ratio of 1:50 was added thereto, and the resulting mixture was stirred for 2 hours. The resulting product was oxidized using potassium permanganate, distilled water was added at 70° C., and stirred for 10 hours. Then, an aqueous solution of hydrogen peroxide was added thereto to obtain graphite oxide. The resulting mixture was subjected to centrifuging, washing with hydrochloric acid (HCl) and distilled water, and dispersing with ultrasonic treatment, to obtain graphene oxide. The resulting graphene oxide was introduced into a solution containing hydrazine and ammonia in a relative weight ratio of 1:7 to reduce the graphene oxide, to obtain functionalized graphene having anion of carboxyl and hydroxyl groups. The surface electric charge of the functionalized graphene had been measured 10 times and the average value was −36 mV.

Step (3'): Coating the Polymer Microparticle with the Graphene

The dispersion of the cationic polystyrene microparticle (0.9 g) in a mixture of isopropanol (200 ml) and deionized water (10 ml) prepared in step (1') was combined with the solution (200 ml) of the functionalized graphene (0.1 g) prepared in step (2'). Then, the resulting mixture was stirred with 100 rpm for 24 hours to obtain a polystyrene microparticle coated with graphene.

Determination of a Form of the Electroconductive Particle

The field scanning electron microscope (SEM, JEOL. JSM 890) scans of the polystyrene microparticle prepared in step (1') of Example 2 are shown in FIG. 4.

Figure 4:
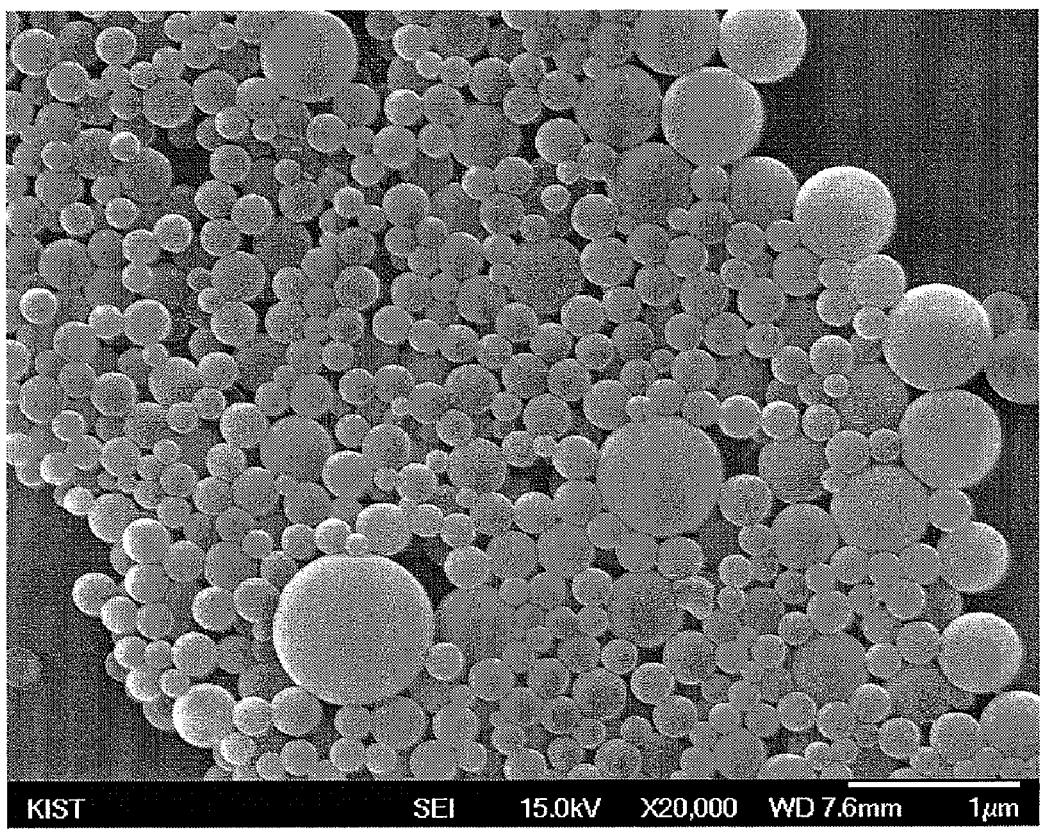
FIG. 4: a scanning electron microscope image of the polymer microparticles prepared in step (1) of Example 2 of the present invention.

As shown in FIG. 4, the polystyrene microparticles prepared in step (1') of Example 2 have an uniform size of about 300 nm.

The field scanning electron microscope (SEM, JEOL. JSM 890) and transmission electron microscope (TEM, PHILIPS, CM 30T) scans of the electroconductive particle prepared in step (3') of Example 2 are shown in FIGS. 5 and 6, respectively.

Figure 5:
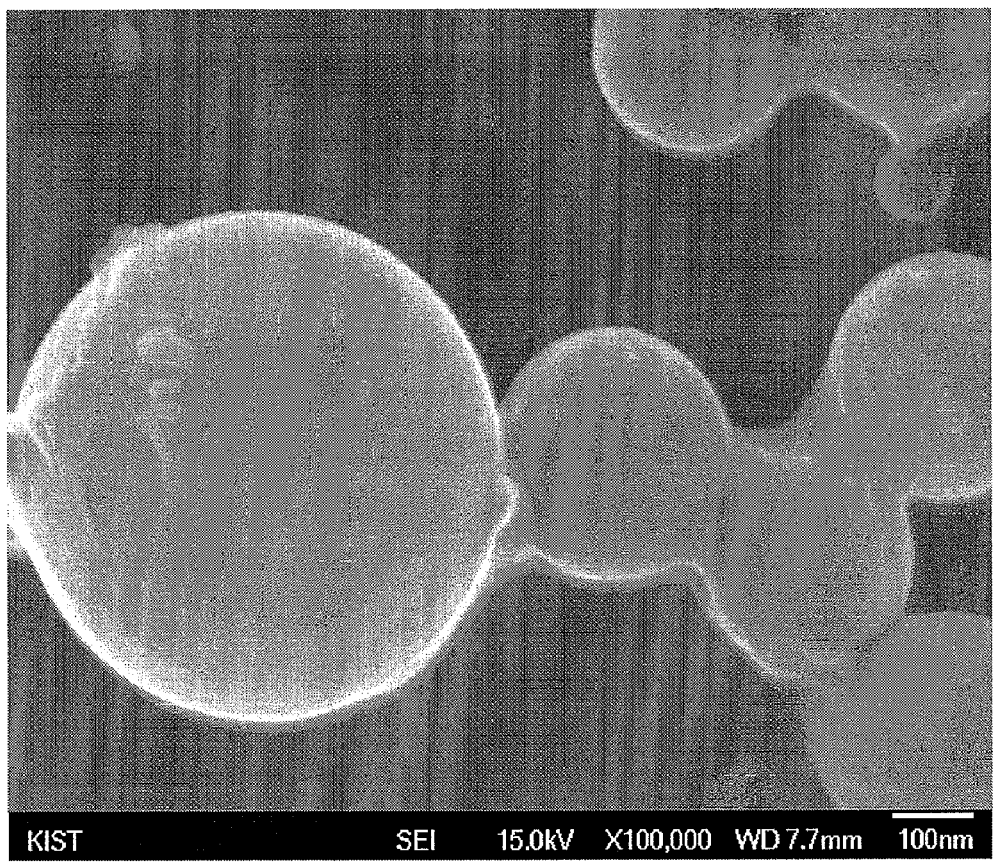
FIG. 5: a scanning electron microscope image of the electroconductive particles prepared in step (3) of Example 2 of the present invention.
Figure 6:
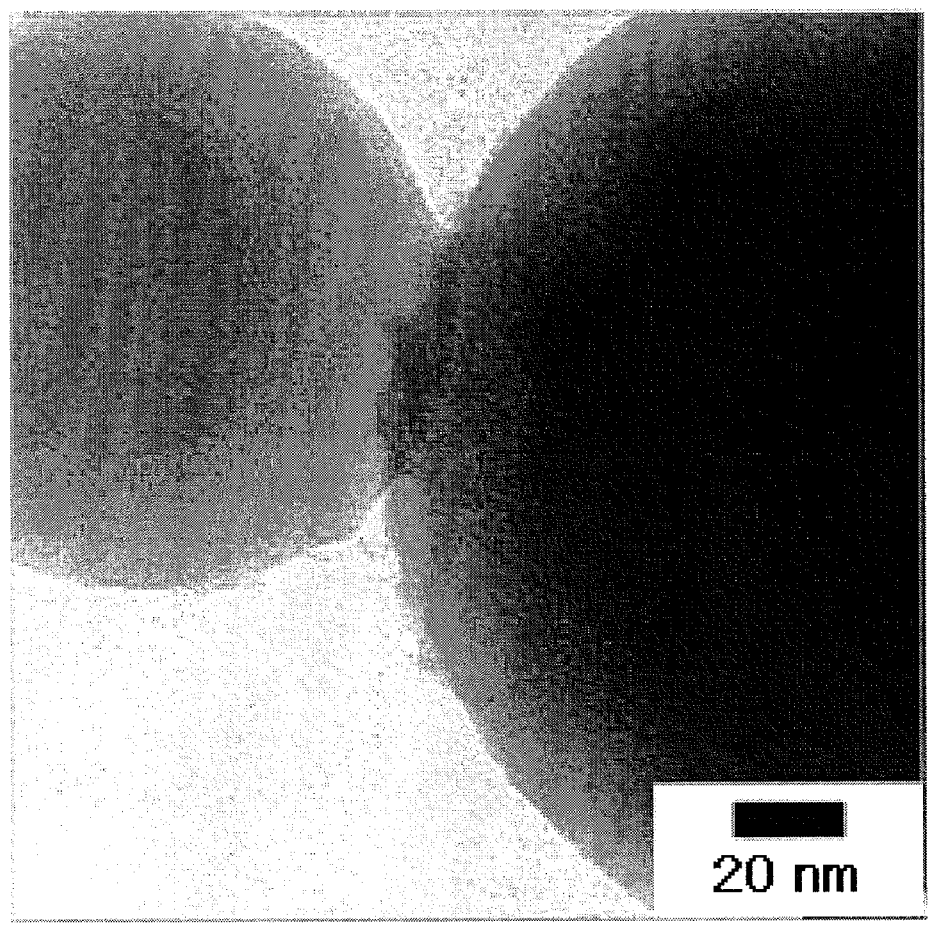
FIG. 6: transmission electron microscope image of the electroconductive particles prepared in step (3) of Example 2 of the present invention.

As shown in FIGS. 5 and 6, ionic bonds were formed by the interaction of the anionic functional groups of the graphene with the cationic functional groups of the polymer microparticle, the graphene coating layer being attached to the polystyrene microparticle through ionic bonds.

The electroconductive microparticles having the graphene coating layer was observed to have almost the same size as the polystyrene microparticles since the graphene coating layer is very thin.

TEST EXAMPLE

Evaluation of the Electroconductivity for the Electroconductive Particles of the Present Invention The electroconductive particles prepared in Examples 1 and 2 were positioned between two plate-type copper electrodes, and the resistance of each of the electroconductive particles was determined using four-probe method. The electroconductivity of each electroparticles prepared in Examples 1 and 2 had been measured 10 times and the result showed that the average values were 600 m$\Omega$/□ and 500 m$\Omega$/□, respectively.

Considering the micropearl AU (Sekisui Chemical Corp.), a representative conventional electroconductive particle coated with metal, has an average resistance value of about 700 m$\Omega$/□, it was found that the electroconductive particle of the present invention has low resistance and improved electroconductivity.

While the invention has been described with respect to the above specific embodiments, it should be recognized that various modifications and changes may be made to the invention by those skilled in the art which also fall within the scope of the invention as defined by the appended claims.

What is claimed is:

1. An electroconductive particle comprising:
   (a) a polymer microparticle comprising a plurality of first functional groups, and
   (b) a graphene coating layer comprising a plurality of second functional groups, the graphene layer grafted on the polymer microparticle via chemical bond formation between the first and second functional groups.

2. The electroconductive particle according to claim 1, wherein the first functional groups are those capable of undergoing a condensation reaction or an ionic coupling interaction.

3. The electroconductive particle according to claim 1, wherein the first functional groups are selected from the group consisting of carboxyl (—COOH), hydroxyl (—OH), ester (—COOR$^1$), amine (—NH$_2$), and thiol (—SH), wherein R$^1$ being C$_1$-C$_{10}$ alkyl, phenyl, or benzyl.

4. The electroconductive particle according to claim 1, wherein the first functional groups are selected from the group consisting of carboxyl, hydroxyl, sulfonyl, quaternary ammonium, and amine.

5. The electroconductive particle according to claim 1, wherein the second functional groups of the graphene coating layer are capable of forming covalent bonds with the first functional groups of the polymer microparticle or capable of forming ionic bonds with the first functional groups of the polymer microparticle.

6. The electroconductive particle according to claim 5, wherein the second functional groups are selected from the group consisting of carboxyl, hydroxyl, sulfonyl, quaternary ammonium, and amine.

7. The electroconductive particle according to claim 1, wherein the second functional groups are selected from the group consisting of carboxyl (—COOH), ester (—COOR$^1$), amine (—NH$_2$), and thiol (—SH), wherein R$^1$ being C$_1$-C$_{10}$ alkyl, phenyl, or benzyl.

8. The electro conductive particle according to claim 1, wherein the chemical bonds are covalent bonds or ionic bonds.

9. The electroconductive particle according to claim 8, wherein the covalent bonds comprise an ester bonding (—COO—), amide bonding (—CONH—), or disulfide bonding (—S—S—) moiety.

10. The electroconductive particle according to claim 8, wherein the ionic bonds are each formed through ionic interactions between $—NR^2_3{}^+$ and $—COO^-$, $—O^-$, or $—S_3{}^-$, wherein $R^2$ being hydrogen, $C_1$-$C_{10}$ alkyl, or $C_6$-$C_{12}$ aryl.

11. The electroconductive particle according to claim 1, wherein the relative weight ratio of the polymer microparticle and the graphene coating layer is 20:80 to 99.9:0.1.

12. The electroconductive particle according to claim 1, wherein the polymer microparticle is a polystyrene-based, polymethacrylate-based, or polyacrylate-based polymer microparticle.

13. The electroconductive particle according to claim 1, wherein the electroconductive particle has an average particle size of 0.1 to 10 μm.

14. An anisotropic conductive film comprising the electroconductive particle according to claim 1.

15. A method for preparing an electroconductive particle comprising:
 providing a polymer microparticle that comprises a plurality of first functional groups attached thereon;
 introducing to a surface of graphene a plurality of second functional groups; and
 grafting together the graphene to the polymer microparticle via chemical bond formation between the first and second functional groups in a dispersion medium.

16. The method of claim 15, wherein providing step comprises:
 mixing together a dispersing agent, a first monomer, an auxiliary monomer, a crosslinking agent into a solvent to form an initial mixture;
 adding a polymerization initiator into the initial mixture to form a polymerization mixture;
 quenching the polymerization mixture to obtain the polymer microparticle;
 washing the polymer microparticle;
 isolating the polymer microparticle from the solvent; and
 lyophilizing the polymer microparticle into a powder form.

17. The method of claim 16, wherein
 the first monomer is selected from the group consisting of styrene, p-hydroxystyrene, p-acetoxystyrene, p-carboxylstyrene, α-methylstyrene, α-chlorostyrene, p-tert-butylstyrene, p-methylstyrene, p-chlorostyrene, o-chlorostyrene, 2,5-dichlorostyrene, 3,4-dichlorostyrene, dimethylstyrene, divinylbenzene, methyl acrylate, methyl methacrylate, ethyl acrylate, ethyl methacrylate, propyl acrylate, propyl methacrylate, butyl acrylate, butyl methacrylate and mixtures thereof;
 the auxiliary monomer is selected from the group consisting of p-hydroxystyrene, p-acetoxystyrene, p-carboxylstyrene, metacryloxyethyl trimethylammoniumchloride, polyethyleneglycol methylmetacrylate, polyethyleneglycol methylethermetacrylate, polyethyleneglycol methacrylate, polypropylene glycol methacrylate, polypropylene glycol dimethacrylate, and mixtures thereof;
 the crosslinking agent is selected from the group consisting of divinylbenzene, styrene-based materials, acryl-based materials, and methacryl-based olephilic materials;
 the polymerization initiator is selected from the group consisting of calcium persulfate, ammonium persulfate, and sodium persulfate, hydrogen peroxide, benzoyl peroxide, lauryl peroxide, azobisisobutyronitril (AIBN) and azobisformamide;
 the dispensing agent is selected from the group consisting of polyvinylpyrrolidone, polyvinylacetate, and hydroxypropyl-cellulose butyl acrylate; and
 the solvent is selected from the group consisting of water, dimethylsulfoxide (DMSO), tetrahydrofuran (THF), dimethyformamide (DMF), ethanol, methanol, isopropanol, propanol, butanol, pentanol, hexanol, heptanol, cyclohexanol, benzene, xylene, toluene, and cyclohexane.

18. The method of claim 15, wherein the introducing step comprises:
 pulverizing graphite;
 oxidizing the pulverized graphite; and
 reducing the oxidized pulverized graphite to obtain the graphene.

19. The method of claim 15, wherein the grafting comprises
 mixing together the polymer microparticle and the graphene to graft together the graphene to the polymer microparticle via chemical bond formation between the first and second functional groups.

20. The method of claim 15, wherein the dispersion medium is selected from the group consisting of distilled water, isopropanol, ethanol, methanol, butanol, chloroform, diethylether, hexane, cyclohexane, propyleneglycol monomethyletheracetate, cyclotetrahydrofuran, and methylethylketone.

* * * * *